US009966219B2

(12) United States Patent
Gubbens et al.

(10) Patent No.: US 9,966,219 B2
(45) Date of Patent: May 8, 2018

(54) ELECTRON ENERGY LOSS SPECTROMETER

(71) Applicant: Gatan, Inc., Warrendale, PA (US)

(72) Inventors: Alexander Jozef Gubbens, Palo Alto, CA (US); Colin Trevor, Pleasanton, CA (US); Ray Dudley Twesten, Livermore, CA (US); Melanie Barfels, Concord, CA (US)

(73) Assignee: GATAN, INC., Warrendale, PA (US)

( * ) Notice: Subject to any disclaimer, the term of this patent is extended or adjusted under 35 U.S.C. 154(b) by 0 days. days.

(21) Appl. No.: 15/321,533

(22) PCT Filed: Jun. 25, 2015

(86) PCT No.: PCT/US2015/037712
§ 371 (c)(1),
(2) Date: Dec. 22, 2016

(87) PCT Pub. No.: WO2015/200649
PCT Pub. Date: Dec. 30, 2015

(65) Prior Publication Data
US 2017/0207058 A1   Jul. 20, 2017

Related U.S. Application Data

(60) Provisional application No. 62/018,294, filed on Jun. 27, 2014, provisional application No. 62/160,381, filed on May 12, 2015.

(51) Int. Cl.
*G21K 1/08* (2006.01)
*H01J 37/05* (2006.01)
(Continued)

(52) U.S. Cl.
CPC .............. *H01J 37/05* (2013.01); *H01J 37/12* (2013.01); *H01J 37/147* (2013.01);
(Continued)

(58) Field of Classification Search
CPC .. H01J 37/05; H01J 37/02; H01J 37/10; H01J 37/147; H01J 37/252; H01J 2235/087; H01J 2237/24455
(Continued)

(56) References Cited

U.S. PATENT DOCUMENTS

| 4,743,756 A * | 5/1988 | Krivanek ............... H01J 49/06 250/305 |
| 5,798,524 A | 8/1998 | Kundmann et al. |

(Continued)

FOREIGN PATENT DOCUMENTS

| CN | 1862761 A | 11/2006 |
| EP | 1441382 A2 | 7/2004 |

(Continued)

OTHER PUBLICATIONS

Yoshida, K.: "A Parellel Detection EELS for an Ultra-HVEM", Journal of Electron Microscopy, Japanese Society for Electron Microscopy. Tokyo, JP, vol. 41, No. 3, Jun. 1, 1992 (Jun. 1, 1992), pp. 147-153, XP000296166, ISSN: 0022-0744, abstract; figure 1, p. 148, left-hand column—p. 149, right-hand column.

(Continued)

*Primary Examiner* — Jason McCormack
(74) *Attorney, Agent, or Firm* — Snyder, Clark, Lesch & Chung, LLP

(57) ABSTRACT

An electron energy loss spectrometer for electron microscopy is disclosed having an electrically isolated drift tube extending through the bending magnet and through subsequent optics that focus and magnify the spectrum. An electrostatic or magnetic lens is located either before or after or both before and after the drift tube and the lens or lenses are adjusted as a function of the bending magnet drift tube voltage to maintain a constant net focal length and to avoid defocusing. An energy selecting slit is included in certain (Continued)

embodiments to cleanly cut off electrons dispersed outside the energy range incident on the detector, thereby eliminating artifacts caused by unwanted electrons scattering back into the spectrum.

19 Claims, 4 Drawing Sheets

(51) Int. Cl.
*H01J 37/12* (2006.01)
*H01J 37/147* (2006.01)
*H01J 37/244* (2006.01)
*H01J 37/28* (2006.01)

(52) U.S. Cl.
CPC ............ *H01J 37/244* (2013.01); *H01J 37/28* (2013.01); *H01J 2237/053* (2013.01); *H01J 2237/12* (2013.01); *H01J 2237/24485* (2013.01); *H01J 2237/2802* (2013.01)

(58) Field of Classification Search
USPC .................................. 250/305, 306, 307, 311
See application file for complete search history.

(56) References Cited

U.S. PATENT DOCUMENTS

| | | | |
|---|---|---|---|
| 6,184,524 | B1 | 2/2001 | Brink et al. |
| 2002/0096632 | A1* | 7/2002 | Kaji .................. G01N 23/2251 250/305 |
| 2006/0011836 | A1* | 1/2006 | Kaji ....................... H01J 37/256 250/310 |
| 2011/0095182 | A1 | 4/2011 | Terada et al. |
| 2011/0220795 | A1* | 9/2011 | Frosien ................. H01J 37/147 250/307 |
| 2015/0034824 | A1* | 2/2015 | Mori ....................... H01J 37/05 250/310 |

FOREIGN PATENT DOCUMENTS

| | | |
|---|---|---|
| EP | 1463089 A2 | 9/2004 |
| JP | 2000515675 A | 11/2000 |
| JP | 2004265879 A | 9/2004 |

OTHER PUBLICATIONS

Yoshida, K. et al.: "Position Control of Electron Energy Loss Spectrum in Case of Accelerating-Voltage Fluctuation", Japanese Journal of Applied Physics, Japan, Society of Applied Physics, vol. 29. No. 11., Nov. 1, 1990 (Nov. 1, 1990), pp. 2531-2534. XP007908770, ISSN: 0021-4922.

Batson, P.E. et al.: "A New Technique for the Scanning and Absolute Calibration of Electron Energy Loss Spectra", Ultramicroscopy 6 (1981) p. 287-290, North-Holland Publishing Company.

International Search Report and Written Opinion issued for the International Application No. PCT/US2015/037712, dated Dec. 11, 2015, 22 pages.

* cited by examiner

ELECTRON ENERGY LOSS SPECTROMETER

CROSS REFERENCE TO RELATED APPLICATIONS

This PCT application claims the benefit under 35 USC 119(e) of provisional application Ser. No. 62/018,294 filed on Jun. 27, 2014 and entitled "Electron Energy Loss Spectrometer" and also of provisional application Ser. No. 62/160,381 filed on May 12, 2015 and bearing the same title. The entire disclosures of the earlier-filed provisional applications are incorporated herein by reference.

FIELD OF THE INVENTION

The invention relates generally to the field of electron microscopy and spectrometry.

BACKGROUND OF THE INVENTION

Electron Energy-Loss Spectroscopy, EELS, is typically practiced on Transmission Electron Microscopes (TEM) at 200-300 kV operating voltage and around 1 eV energy resolution. Recently there has been a drive to much lower operating voltage (e.g. 15 kV) and higher energy resolution (e.g. 5 meV). The electron energy-loss spectrum extends from 0 to many keVs energy-loss. The intensity of the energy-loss spectrum falls off rapidly with energy loss, and EELS studies are typically limited to about 3 keV energy loss. This range is expected to increase in the future with improvements in detector technology.

With reference to FIG. 1, in the typical electron energy loss spectrometer an electron beam 5 emerges from a transmission electron microscope 1 and enters the spectrometer through an aperture 10. A bending magnet 13 bends the electron beam over an angle, typically 90 degrees, to introduce energy dispersion. The resulting energy-loss spectrum is electron optically magnified, focused and projected by lenses 15, 16, 17 on a purpose-designed electron detector 21. Focusing is important in the dispersion direction, the spectrum is not necessarily focused in the non-dispersion direction. The detector records what is effectively a window on the energy-loss spectrum. This window has a starting and an ending energy-loss. The starting energy loss is typically set by adjusting the TEM high voltage, the magnetic field of the bending magnet, or the voltage on an isolated drift tube 14 through the bending magnets. Adjusting any of these moves the whole energy-loss spectrum relative to the detector in order to view different regions of interest of the spectrum. The drift tube method is normally preferred as it is very fast (under 1 ms is possible) accurate (under 1 meV is possible) and repeatable (under 1 meV is possible). The width of the recorded window in eV follows from the energy dispersion in eV/m at the detector. Smaller dispersions give larger fields of view in eV, larger dispersions smaller fields of view. The dispersion is controlled by changing the electron optical lenses 16, 17 between the bending magnet 13 and the detector 21. Changing the dispersion, effectively changing the magnification, allows one to zoom in and out of particular spectral details. The electron optics typically uses magnetic quadrupoles for the control of the first order properties such as focus and magnification, as well as a combination of magnetic sextupoles, octupoles, decapoles and dodecapoles to minimize various electron-optical aberrations introduced by the bending magnet and the post bending magnet optics 16, 17. One could use electrostatic instead of magnetic multipoles.

At lower operating voltages and higher energy resolutions, two problems become particularly noticeable, whenever the bending magnet drift tube is employed to shift the spectrum. First, a lens effect occurs at the start and end of the drift tube. Second, because the range of electron energies through the rest of the spectrometer optics has now changed, that optics is somewhat out of focus. These problems cause the EEL spectrum to defocus slightly, limiting energy resolution and spectrum quality.

The portions of the electron energy-loss spectrum that fall outside the field of view recorded by the detector must be trapped carefully so that the electrons do not scatter inside the spectrometer and hit the detector. In practice, this is very difficult and EEL spectrometers typically suffer from what are called reflections. Here the leading and trailing sections of the energy loss spectrum scatter off the drift tube walls causing possible artifacts within the spectrum window as recorded by the detector. Other locations and forms of scattering are possible too. The artifacts can obscure spectral features, make their analysis impossible, and/or be wrongfully interpreted as spectral information itself. In the prior art, scattered electrons are typically intercepted by adding baffles 18 that prevent them from reaching the detector. While reasonably effective this does not stop all scattered electrons and some artifacts typically remain.

DESCRIPTION OF THE PREFERRED EMBODIMENT OF THE INVENTION

Figure 1:
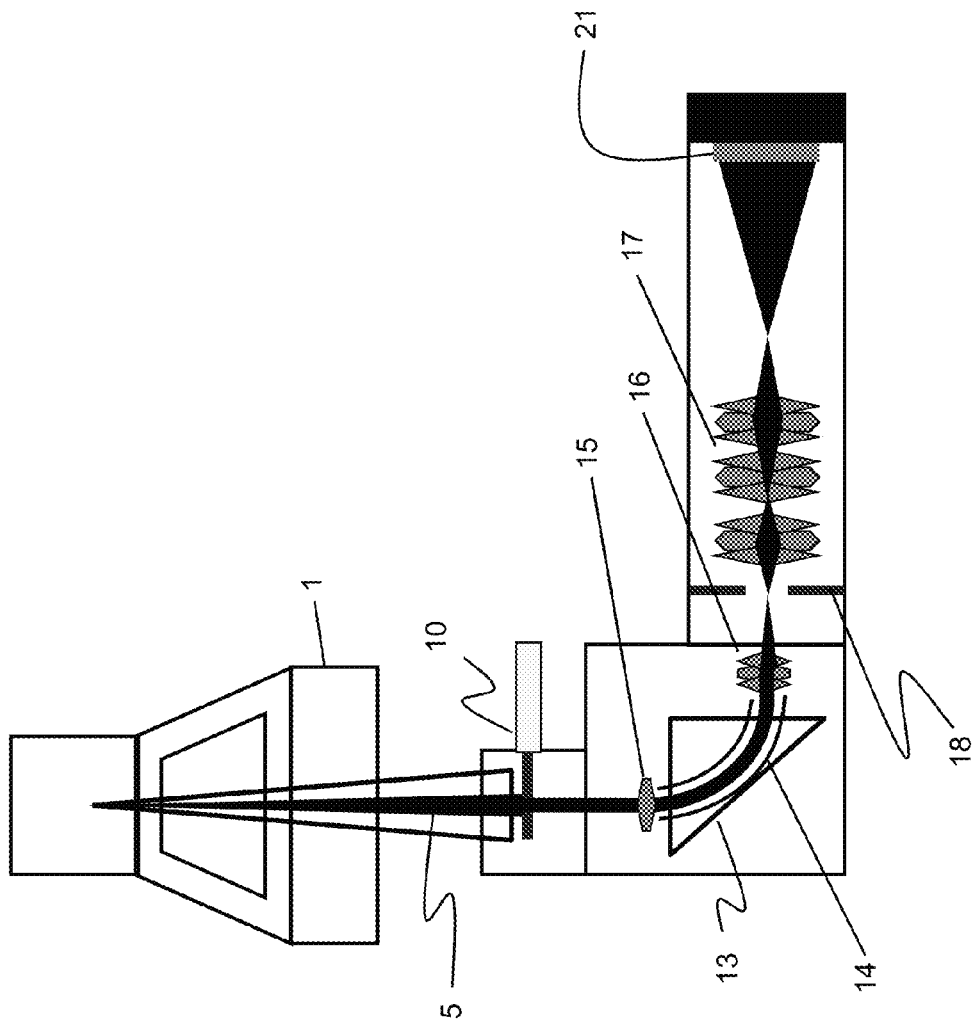
FIG. 1 is a block diagram of an prior art electron energy loss spectrometer.
Figure 2:
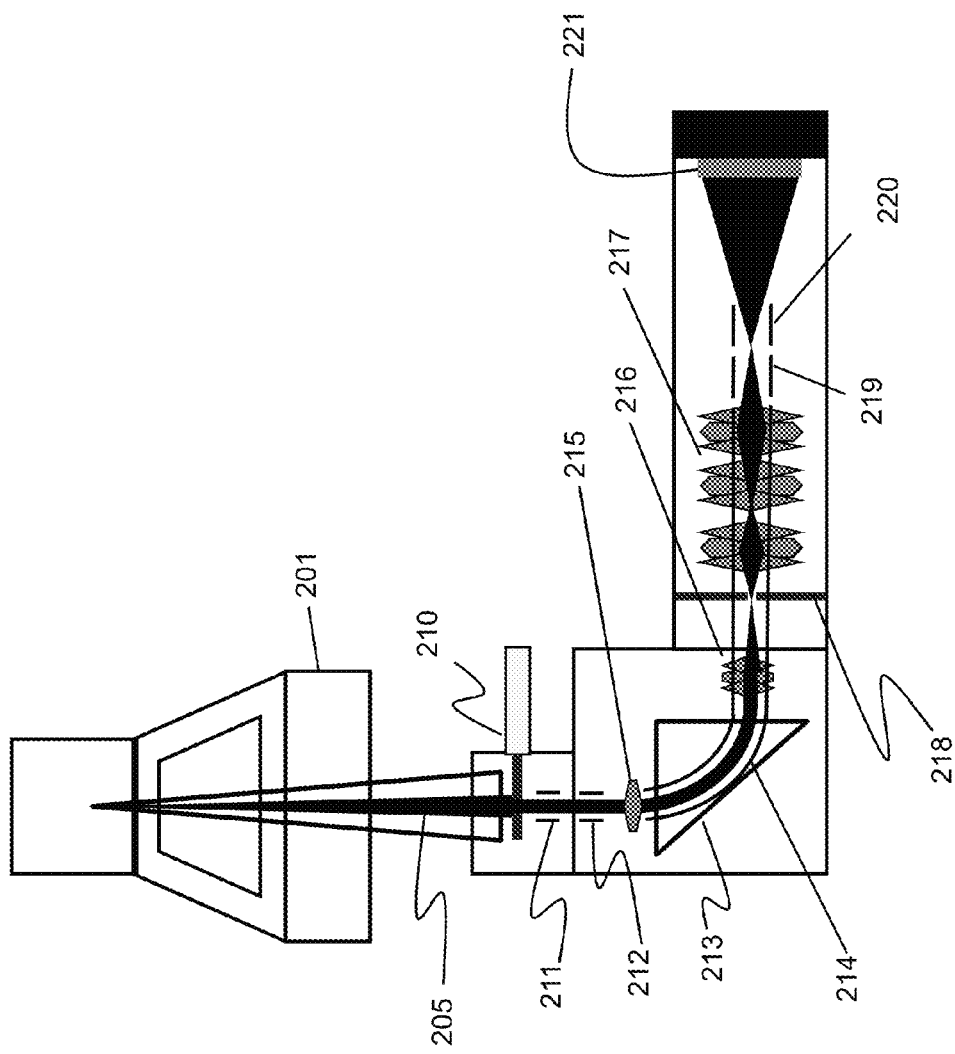
FIG. 2 is a block diagram of an exemplary electron energy loss spectrometer according to the invention.

With reference to FIG. 2, in an embodiment of the invention, there is a beam 205 emerging from a transmission electron microscope 201 entering the spectrometer through an aperture 210. An electrostatic lens system 211, 212 and 219, 220 is respectively added to the prior art device before and after the bending magnet drift tube 214. These lenses are adjusted as a function of the bending magnet drift tube voltage so that the net focal length is constant and no defocusing occurs. Reference items 211 and 220 depict grounded tubes and 212, 219 are voltage biased lens elements.

In a further embodiment, the isolated drift tube 214 is extended throughout the entire optics 216, 217, not just the bending magnet 214, so that the range of electron energies in all the optics is constant and no defocusing occurs.

In a further embodiment, the electrostatic lenses 212, 219 are round electrostatic lenses. In a further embodiment the electrostatic lenses are located at the start 212 and end 219 of the bending magnet drift tube. In the case of the EEL spectrometer that can serve as an Imaging Energy Filter as well, the energy selecting slit 218 is floated at the voltage V, to prevent electrostatic lens effects around the slit. In further embodiments, there are fewer or more than two electrostatic lenses. In a further embodiment, multi-pole lenses are used instead of round lenses. In further embodiments magnetic lenses are used instead of electrostatic lenses.

In a further embodiment, an intermediate focused spectrum is formed in the system.

Figure 3:
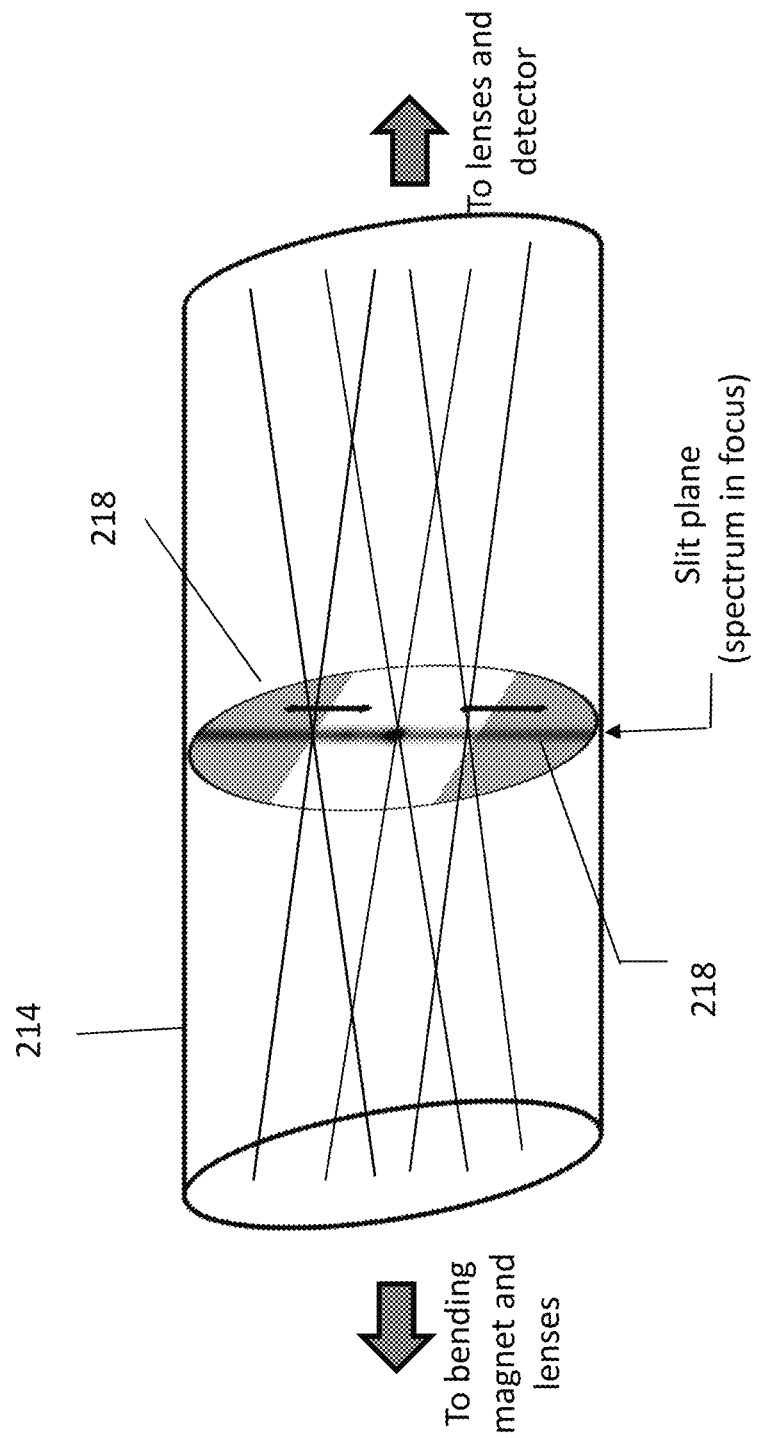
FIG. 3 is a plan view of an exemplary drift tube comprising an energy-selecting slit.
Figure 4:
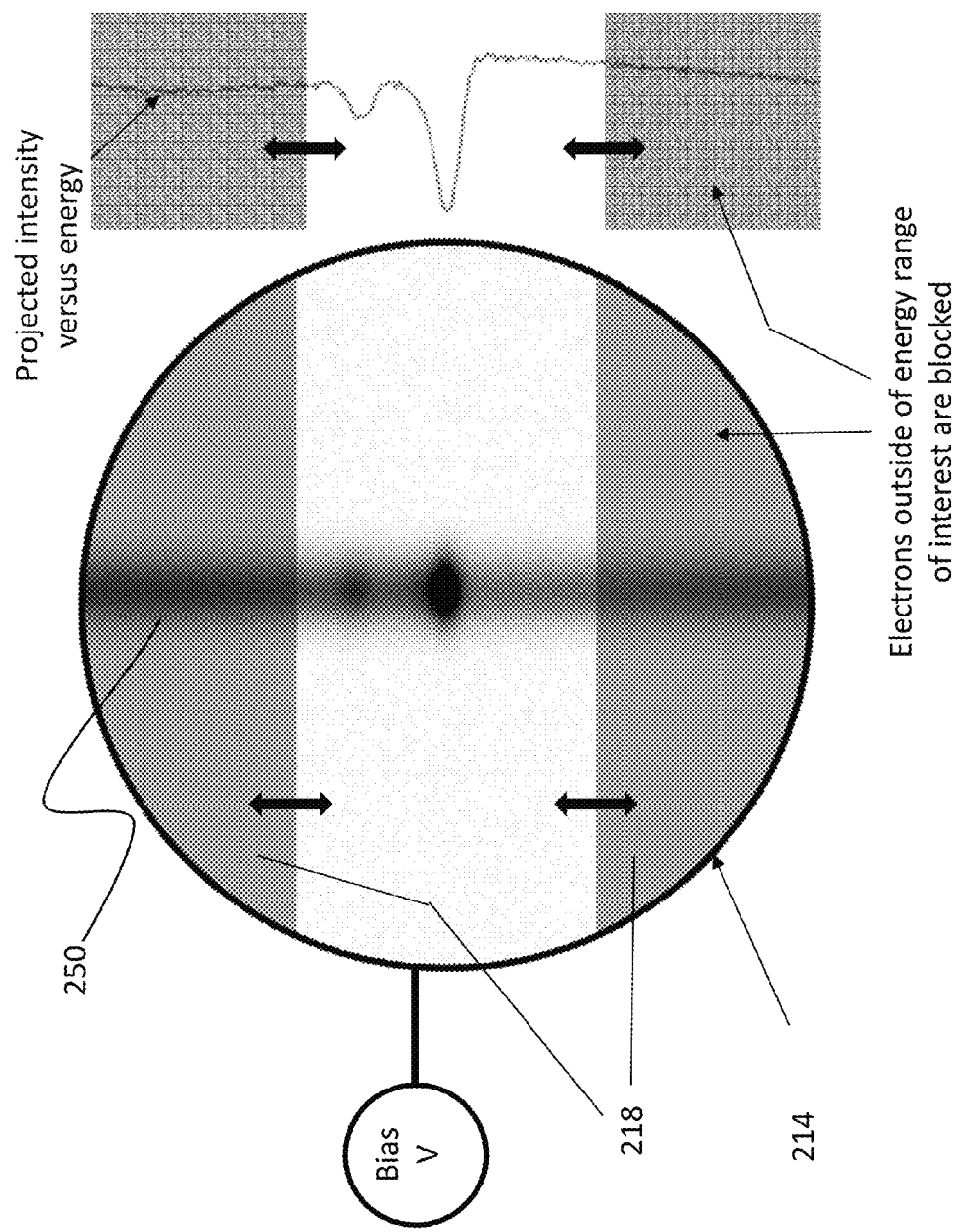
FIG. 4 is a cross-sectional view of an exemplary adjustable energy-selecting slit and a graph of projected intensity versus energy for the spectrum.

In this embodiment shown in FIGS. 2, 3 and 4, a slit 218 is placed at the focused spectrum 250 with a width in eV equal to the field of view in eV to be detected by the detector. Exemplary placement of the slit is shown in FIG. 2. The slit is imaged by following optics 217 to match the size of the detector 221 in the dispersion direction, so that electrons that are outside of the detector field of view cannot proceed in the spectrometer past the slit. These electrons are cleanly and sharply trapped by the slit and can therefore no longer scatter off of drift tube walls. In this embodiment, the slit width is adjustable as depicted by double-headed arrows in FIGS. 3 and 4 and is adjusted with varying dispersion such that it always closely matches the field of view in eV to be detected by the detector. The slit is floated at a controllable electrostatic potential (labeled "Bias V" in FIG. 4.)

In a further embodiment, the slit edges are positioned symmetrically around the optical axis, so that the entire detected spectrum is as near the optical axis as possible. This will minimize the generation of off-axis electron optical aberrations. In a further embodiment, the slit edges are individually adjustable.

In a further embodiment the slit is held at the same potential as the electrostatic drift tube throughout the system. In a further embodiment, the spectrum at the slit is not fully in focus.

In a further embodiment, there is no focused spectrum in the spectrometer except for at the detector plane. In a further embodiment the slit is held at an electrostatic potential different than the drift tubes through the system. In a further embodiment the slit is used in combination with baffles.

We claim:

1. An electron energy loss spectrometer for transmission electron microscopy comprising:
    a bending magnet,
    an electrically isolated drift tube, having entrance and exit ends and held at a drift tube potential and having entrance and exit ends and being in proximity to said bending magnet,
    one or more electrostatic lenses located at either end or at both ends of said drift tube wherein
    said electrostatic lens or lenses is or are adjusted as a function of said drift tube potential to create a constant net focal length at either end or both ends of said drift tube, and
    a plurality of optics arranged to produce an intermediate focus of an electron energy loss spectrum within the spectrometer, to magnify the energy loss spectrum projected onto a detector and to minimize electron-optical aberrations.

2. The electron energy loss spectrometer of claim 1 wherein said isolated drift tube is extended throughout said plurality of optics so that there is a constant range of electron energies in said plurality of optics.

3. The electron energy loss spectrometer of claim 1, wherein said lens or lenses is or are multipole electrostatic lenses and wherein said lens or lenses is or are adjusted to maintain spectrum focus at said detector during a change in said drift tube potential and to compensate for aberrations.

4. The electron energy loss spectrometer of claim 1, comprising at least one of said electrostatic lenses located at said entrance and said exit of said drift tube.

5. The electron energy loss spectrometer of claim 1, wherein a single electrostatic lens or a plurality of electrostatic lenses is located at said entrance of said drift tube.

6. The electron energy loss spectrometer of claim 1, wherein a single electrostatic lens or a plurality of electrostatic lenses is located at said exit of said drift tube.

7. The electron energy loss spectrometer of claim 1, and further comprising an energy selecting slit, said slit being configured to float at a slit electrical potential configured to prevent lens effects around said slit by matching said slit potential to said potential of said drift tube.

8. The electron energy loss spectrometer of claim 1, and further comprising an energy selecting slit, said slit being configured to float at a slit electrical potential configured to intentionally introduce lens effects around said slit by offsetting said slit electrical potential with respect to said potential of said drift tube.

9. The electron energy loss spectrometer of claim 7, wherein said energy selecting slit edges are positioned independently about an optical axis of the spectrometer and said energy loss spectrum is brought into intermediate focus in the vicinity of said slit by said plurality of optics in order to cleanly cut-off electrons outside of a field of view of the detector.

10. The electron energy loss spectrometer of claim 8, wherein said energy selecting slit edges are positioned independently about an optical axis of the spectrometer and said energy loss spectrum is brought into intermediate focus in the vicinity of said slit by said plurality of optics in order to cleanly cut-off electrons outside of a field of view of the detector.

11. The electron energy loss spectrometer of claim 9, further comprising additional baffles configured for use in conjunction with said energy selecting slit to cleanly cut-off electrons outside of the detector field of view.

12. The electron energy loss spectrometer of claim 10, further comprising additional baffles configured for use in conjunction with said energy selecting slit to cleanly cut-off electrons outside of the detector field of view.

13. The electron energy loss spectrometer of claim 7, wherein said edges of said energy selecting slit are positioned symmetrically around an optical axis so as to place the electron energy loss spectrum as near the optical axis as possible.

14. The electron energy loss spectrometer of claim 7, wherein said energy selecting slit has an adjustable slit width.

15. The electron energy loss spectrometer of claim 8, wherein said energy selecting slit has an adjustable slit width.

16. The electron energy loss spectrometer of claim 7, wherein said electron energy loss spectrum is at least partially out of focus at said energy selecting slit.

17. The electron energy loss spectrometer of claim 8, wherein said electron energy loss spectrum is at least partially out of focus at said energy selecting slit.

18. The electron energy loss spectrometer of claim 1, wherein the electron energy loss spectrum is only in focus at the detector and nowhere else in the spectrometer.

19. The electron energy loss spectrometer of claim 1, wherein said lens or lenses is or are multipole electrostatic lenses and wherein said lens or lenses is or are adjusted to maintain spectrum focus at said detector during a change in said drift tube potential.

\* \* \* \* \*